US010177286B2

(12) United States Patent
Park et al.

(10) Patent No.: US 10,177,286 B2
(45) Date of Patent: Jan. 8, 2019

(54) LIGHT EMITTING ELEMENT PACKAGE HAVING THREE REGIONS

(71) Applicant: LG INNOTEK CO., LTD., Seoul (KR)

(72) Inventors: In Yong Park, Seoul (KR); Gun Kyo Lee, Seoul (KR); Jong Woo Lee, Seoul (KR); Ju Young Lee, Seoul (KR); Yun Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 205 days.

(21) Appl. No.: 14/779,896

(22) PCT Filed: Mar. 25, 2014

(86) PCT No.: PCT/KR2014/002485
§ 371 (c)(1),
(2) Date: Sep. 24, 2015

(87) PCT Pub. No.: WO2014/157905
PCT Pub. Date: Oct. 2, 2014

(65) Prior Publication Data
US 2016/0056345 A1 Feb. 25, 2016

(30) Foreign Application Priority Data

Mar. 25, 2013 (KR) .................. 10-2013-0031494

(51) Int. Cl.
*H01L 25/075* (2006.01)
*H01L 33/50* (2010.01)
(Continued)

(52) U.S. Cl.
CPC .............. *H01L 33/50* (2013.01); *F21S 43/14* (2018.01); *F21S 43/195* (2018.01);
(Continued)

(58) Field of Classification Search
CPC . H01L 2224/48091; H01L 2924/00014; H01L 25/0753; H01L 2224/48247; H01L 2924/12041
(Continued)

(56) References Cited

U.S. PATENT DOCUMENTS

2004/0099874 A1* 5/2004 Chang .................. H01L 33/486
257/98
2006/0245188 A1 11/2006 Takenaka
(Continued)

FOREIGN PATENT DOCUMENTS

| CN | 102027596 A | 4/2011 |
| CN | 102130107 A | 7/2011 |

(Continued)

OTHER PUBLICATIONS

English Translation for WO 2010/112419 A1.*

*Primary Examiner* — David Chen
(74) *Attorney, Agent, or Firm* — Birch, Stewart, Kolasch & Birch, LLP

(57) ABSTRACT

A light-emitting element package, according to one embodiment of the present invention, comprises: a circuit board including first and second regions having different heights; light-emitting elements respectively disposed in the first and second regions; and phosphor layers respectively disposed on the light-emitting elements, wherein the light-emitting elements are disposed within a 100-μm distance in the horizontal direction.

13 Claims, 10 Drawing Sheets

(51) Int. Cl.
    *H01L 33/62*         (2010.01)
    *F21S 43/19*         (2018.01)
    *F21S 43/14*         (2018.01)
    *H01L 33/64*         (2010.01)

(52) U.S. Cl.
    CPC .......... *H01L 25/0756* (2013.01); *H01L 33/62* (2013.01); *H01L 25/0753* (2013.01); *H01L 33/642* (2013.01); *H01L 2224/45139* (2013.01); *H01L 2224/48091* (2013.01); *H01L 2924/00014* (2013.01)

(58) Field of Classification Search
    USPC ........................................ 257/88, 89, E25.02
    See application file for complete search history.

(56) References Cited

U.S. PATENT DOCUMENTS

| | | | |
|---|---|---|---|
| 2008/0129204 A1 | 6/2008 | Tsukamoto et al. | |
| 2009/0050908 A1* | 2/2009 | Yuan | F21K 9/00 257/88 |
| 2009/0201662 A1 | 8/2009 | Kim | |
| 2009/0267794 A1* | 10/2009 | Chang | G08G 1/095 340/907 |
| 2010/0219433 A1* | 9/2010 | Lin | H01L 24/05 257/98 |
| 2010/0231824 A1* | 9/2010 | Nakata | H01L 33/62 349/62 |
| 2010/0252842 A1* | 10/2010 | Tsang | H01L 25/0753 257/89 |
| 2011/0024773 A1 | 2/2011 | Lu et al. | |
| 2011/0062464 A1 | 3/2011 | Gerhard | |
| 2011/0101383 A1* | 5/2011 | Hermann | H01L 25/0756 257/88 |
| 2014/0203306 A1* | 7/2014 | Ito | H01L 33/505 257/88 |
| 2014/0367708 A1* | 12/2014 | Sorg | H01L 25/0753 257/88 |

FOREIGN PATENT DOCUMENTS

| | | | | |
|---|---|---|---|---|
| CN | 102959746 A | | 3/2013 | |
| DE | 102010024864 A1 | | 12/2011 | |
| EP | 2378576 A2 | | 10/2011 | |
| JP | 9-148711 A | | 6/1997 | |
| JP | 2007-103901 A | | 4/2007 | |
| JP | 2008-211261 A | | 9/2008 | |
| JP | 2008-277071 A | | 11/2008 | |
| JP | 2008-294224 A | | 12/2008 | |
| JP | 2011-521448 A | | 7/2011 | |
| JP | 4813309 B2 | | 11/2011 | |
| KR | 10-2008-0027601 A | | 3/2008 | |
| KR | 10-2010-0098463 A | | 9/2010 | |
| WO | WO 2010/046339 A1 | | 4/2010 | |
| WO | WO 2010112419 A1 * | | 10/2010 | F21K 9/00 |

\* cited by examiner

[Fig. 1]
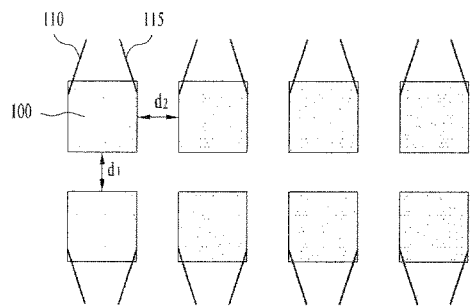
[Fig. 2]
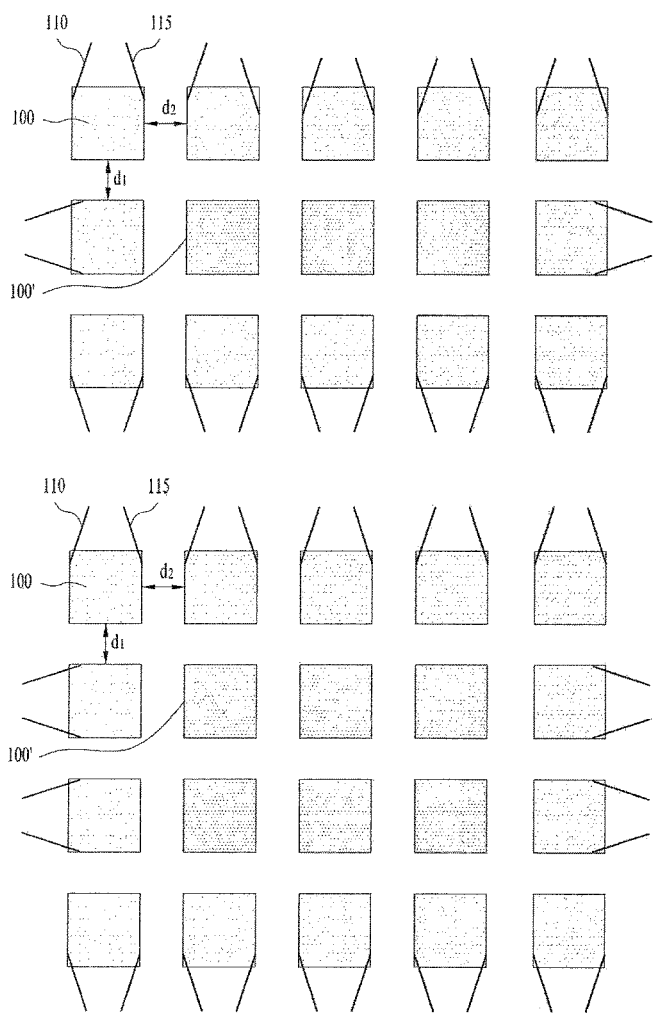

[Fig. 3]
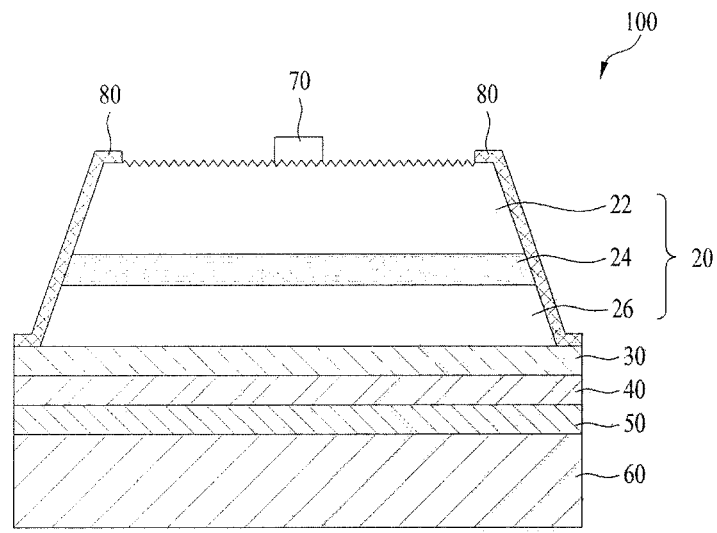
[Fig. 4a]
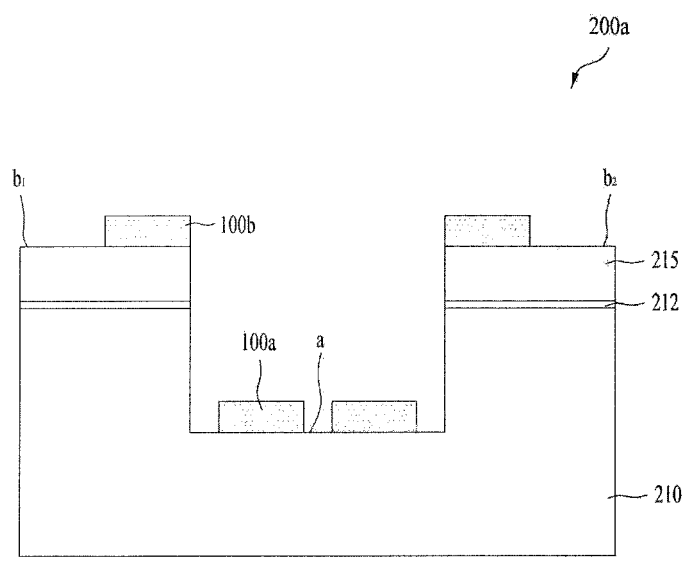

[Fig. 4b]
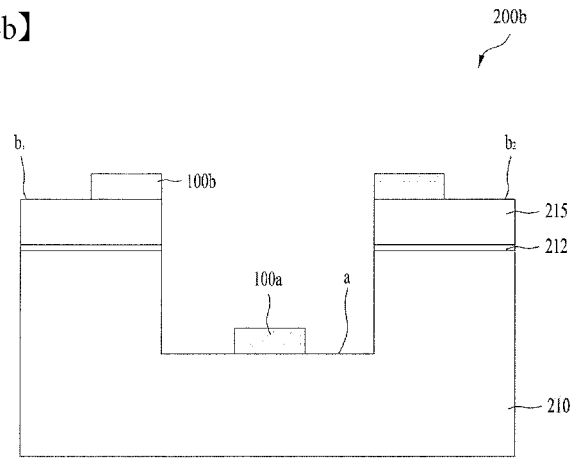
[Fig. 5a]
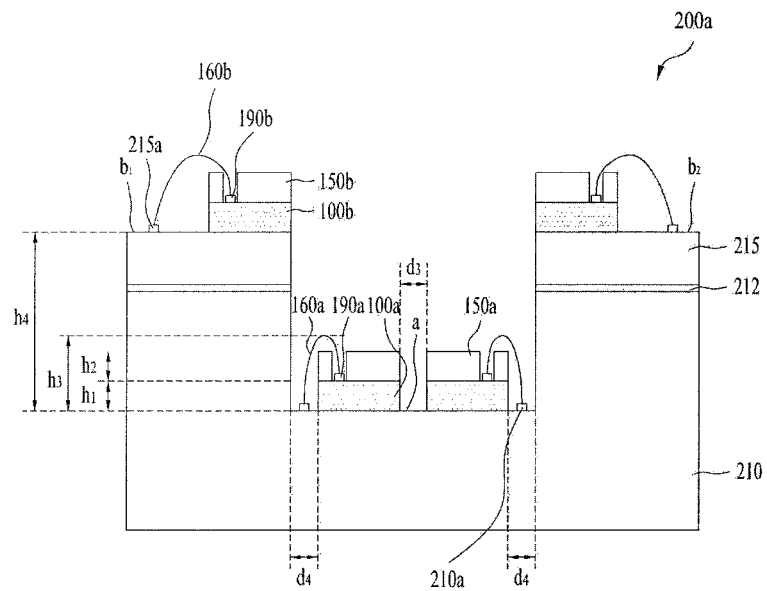

[Fig. 5b]
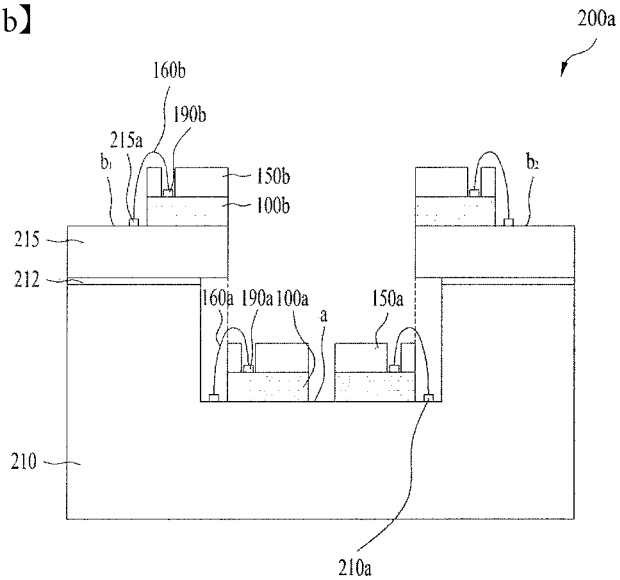
[Fig. 6]
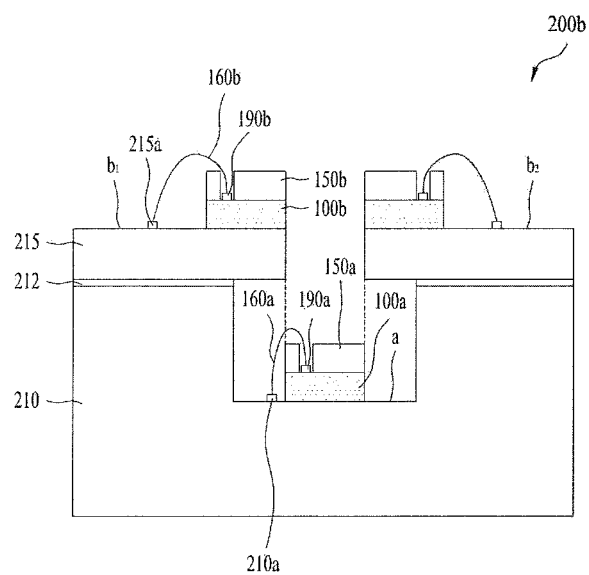

[Fig. 7a]
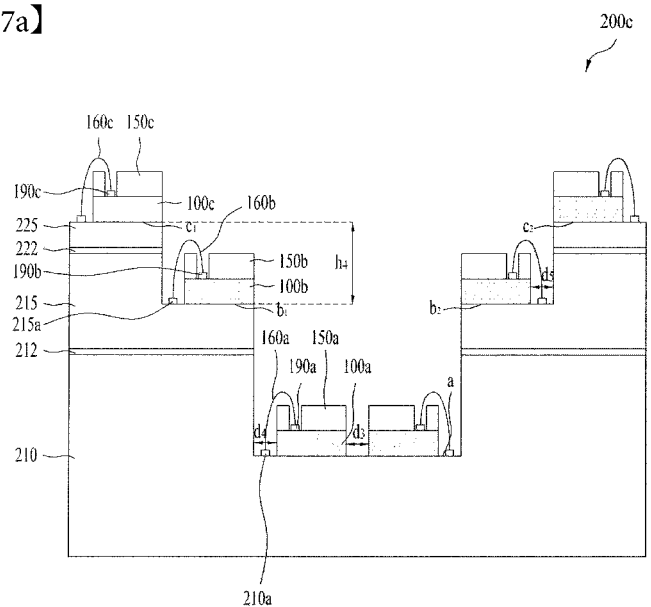
[Fig. 7b]
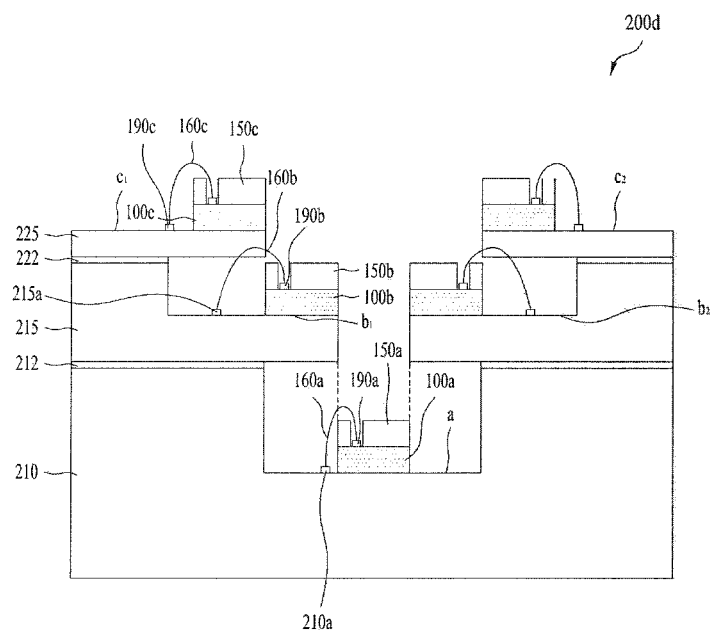

[Fig. 8a]
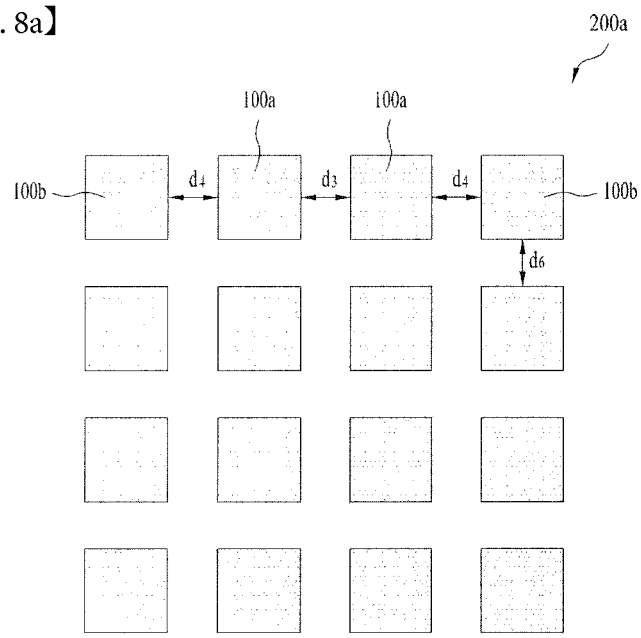
[Fig. 8b]
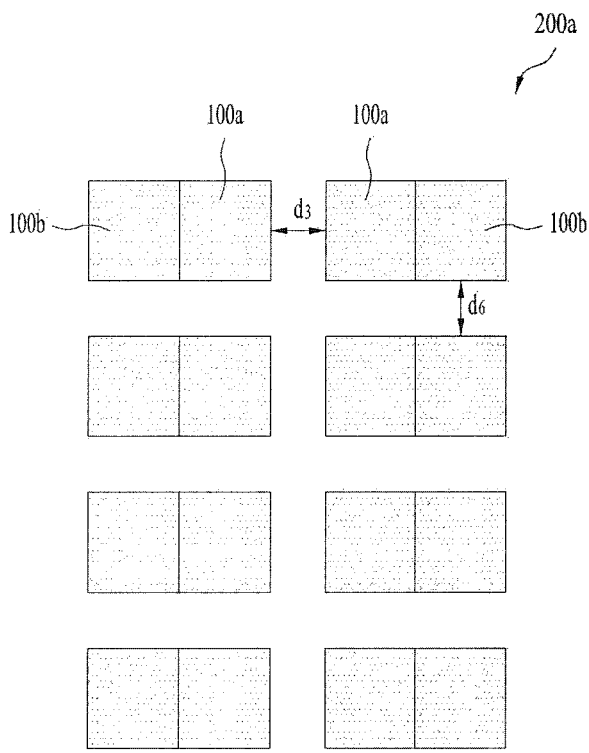

[Fig. 8c]
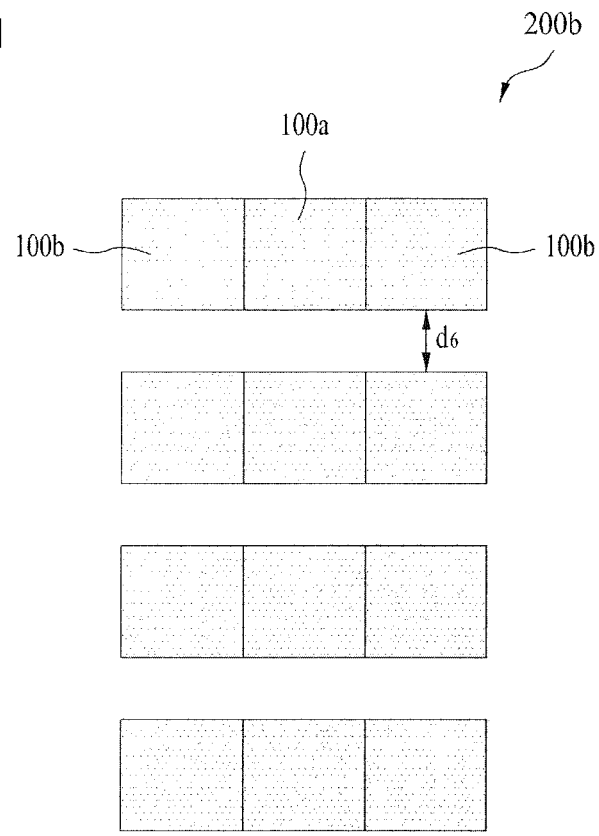
[Fig. 8d]
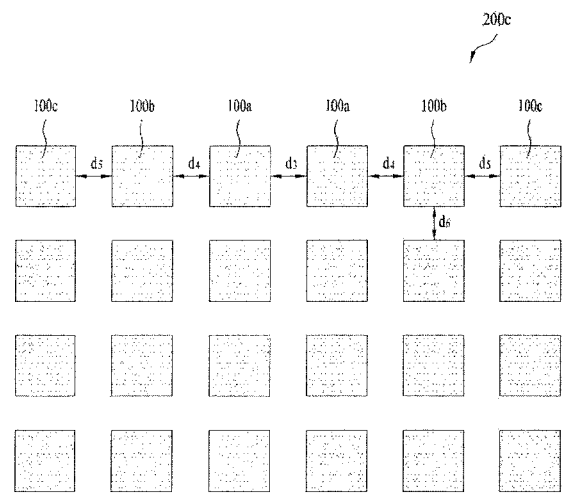

[Fig. 8e]
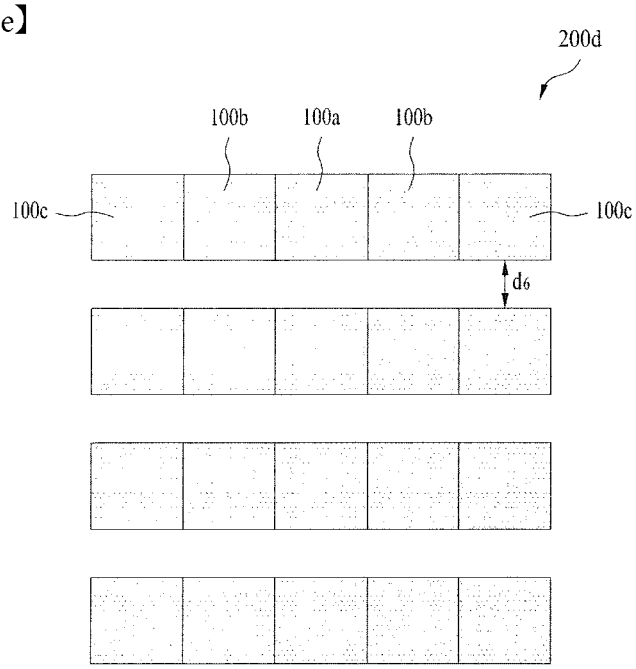
[Fig. 9a]
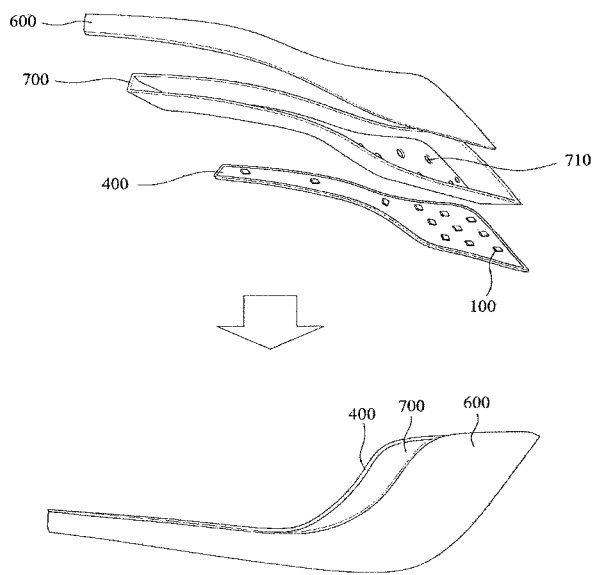

[Fig. 9b]
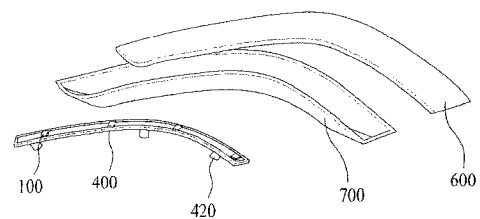
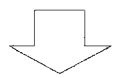
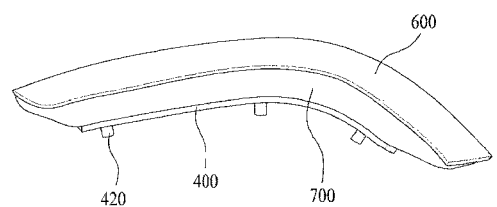
[Fig. 9c]
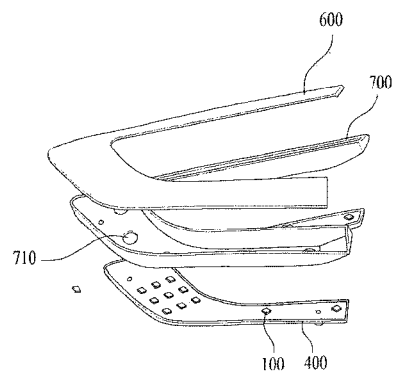
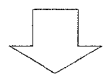
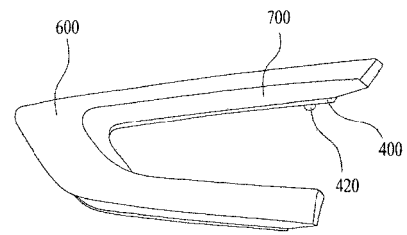

[Fig. 10]
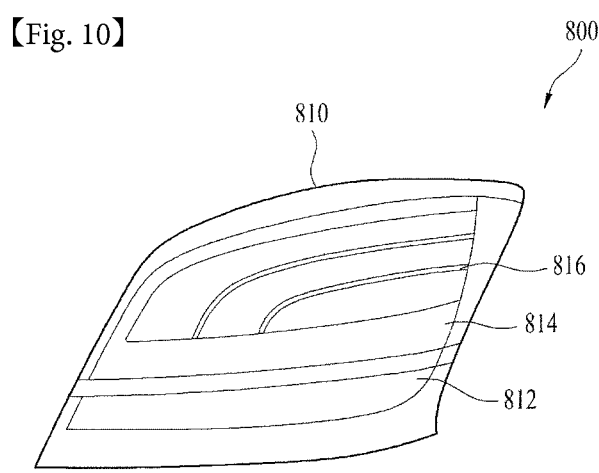

LIGHT EMITTING ELEMENT PACKAGE HAVING THREE REGIONS

TECHNICAL FIELD

Embodiments relate to a light emitting element package.

BACKGROUND ART

Group III-V compound semiconductors, such as GaN and AlGaN, are widely used for optoelectronics and electronics because of many advantages, such as easily controllable wide band gap energy.

In particular, light emitting elements, such as light emitting diodes or laser diodes, which use group III-V or II-VI compound semiconductors, are capable of emitting visible and ultraviolet light of various colors, such as red, green, and blue, owing to development of element materials and thin film growth techniques. These light emitting elements are also capable of emitting white light with high luminous efficacy through use of a fluorescent substance or color combination and have several advantages of low power consumption, semi-permanent lifespan, fast response speed, safety, and environmental friendliness, as compared to conventional light sources, such as fluorescent lamps and incandescent lamps.

Accordingly, application fields of the light emitting elements are expanded to transmission modules of optical communication units, light emitting diode backlights to replace Cold Cathode Fluorescence Lamps (CCFLs) which serve as backlights of Liquid Crystal Displays (LCDs), white light emitting diode lighting apparatuses to replace fluorescent lamps or incandescent lamps, vehicular headlight, and traffic lights.

In a lighting apparatus or a vehicular headlight, s light emitting element package having a plurality of light emitting elements disposed in one unit may be used and each light emitting element may receive current using a method, such as wire-bonding.

FIG. 1 is a view illustrating an arrangement in a light emitting element package.

A plurality of light emitting elements 100 is arranged in four columns and two rows and the respective light emitting elements 100 are bonded by wires 110 and 115. The neighboring light emitting elements 100 are separated from each other by a distance $d_1$ in the vertical direction and a distance $d_2$ in the horizontal direction. When the separation distances between the neighboring light emitting elements 100 are greater than $d_1$ and $d_2$, dark regions may be generated.

FIG. 2 is a view illustrating formation of dark regions in a three-row light emitting element package.

A plurality of light emitting elements 100 and 100' is arranged in four columns and three rows and the respective light emitting elements 100 and 100' are bonded by wires 110 and 115. When the neighboring light emitting elements 100 are arranged such that they are separated from each other by a distance $d_1$ in the vertical direction and a distance $d_2$ in the horizontal direction so as to prevent generation of dark regions, it is difficult to assure spaces required to perform wire bonding of the light emitting elements 100' disposed at the inside.

That is, when light emitting elements are arranged in three or more rows, spaces for wire-bonding of light emitting elements which are not adjacent to the outside are required and these spaces may be represented as dark regions in a light emitting element package.

DISCLOSURE

Technical Problem

Embodiments provide a light emitting element package which may be implemented as a surface light source of a vehicular headlight without dark regions.

Technical Solution

In one embodiment, a light emitting element package includes a circuit board unit including a first region and second regions having a greater height than that of the first region, the second regions including a $(2\text{-}1)^{th}$ region and a $(2\text{-}2)^{th}$ region being opposite each other across the first region, at least one light emitting element disposed in each of the first region and the second regions, and a phosphor layer disposed on the respective light emitting elements, wherein the respective light emitting elements are disposed by a distance of within 100 μm in the horizontal direction.

In the circuit board unit, a second circuit board of the first region and second circuit boards of the second regions may contact each other.

The height of the second regions may be greater than the height of the first region. Two rows of light emitting elements may be disposed in the first region so as to be separated from each other by 50 μm to 100 μm.

The light emitting element in the first region and the light emitting element in the second region, disposed adjacent to each other, may be disposed by a distance of greater than 0 μm and less than 100 μm in the horizontal direction.

One to two rows of light emitting elements may be disposed in the first region and one row of light emitting elements may be disposed in each of the $(2\text{-}1)^{th}$ region and the $(2\text{-}2)^{th}$ region.

A height difference between the bottom surface of the first region and the bottom surfaces of the second regions may be 160 μm to 5 mm.

The height of the respective light emitting elements may be 90 μm to 100 μm and the height of the phosphor layer may be 50 μm to 60 μm.

Output of the light emitting element disposed in the first region may be greater than output of the light emitting elements disposed in the second regions.

The circuit board unit may further include third regions disposed at a greater height than that of the second regions, the third regions may include a $(3\text{-}1)^{th}$ region and a $(3\text{-}2)^{th}$ region being opposite each other across the second regions, and at least one light emitting element may be disposed in each of the $(3\text{-}1)^{th}$ region and the $(3\text{-}2)^{th}$ region.

The light emitting element in the third region may be disposed by a distance of within 100 μm in the horizontal direction from the light emitting element in the second region.

The light emitting element in the second region and the light emitting element in the third region, disposed adjacent to each other, may be disposed by a distance of greater than 0 μm and less than 100 μm in the horizontal direction.

A height difference between the bottom surfaces of the second regions and the bottom surfaces of the third regions may be 160 μm to 5 mm.

Output of the light emitting elements disposed in the second regions may be greater than output of the light emitting elements disposed in the third regions.

In another embodiment, a light emitting element package includes a circuit board unit including at least two regions having different heights, at least one light emitting element disposed in each of the at least two regions, and a phosphor layer disposed on the respective light emitting elements, wherein the respective light emitting elements are disposed by a distance of within 100 μm in the horizontal direction.

The circuit board unit may include a first region, second regions having a greater height than that of the first region, and third regions having a greater height than that of the second regions, and the at least one light emitting element is disposed in each of the first region, the second regions and the third regions.

A height difference between the first region and the second regions may be equal to a height difference between the second regions and the third regions.

A pair of second regions may be disposed opposite each other across the first region so as to be symmetrical to each other.

The light emitting elements respectively disposed in the pair of second regions may be disposed so as to be symmetrical to each other with respect to the first region.

A pair of third regions may be disposed opposite each other across the first region so as to be symmetrical to each other, and the light emitting elements respectively disposed in the pair of third regions may be disposed so as to be symmetrical to each other with respect to the first region.

Advantageous Effects

In a light emitting element package in accordance with one embodiment, light emitting element arrays may be disposed adjacent to each other and thus implement a surface light source and, when the respective light emitting elements are connected in parallel, local dimming in which current is supplied to some light emitting elements in one light emitting element package may be implemented. Through such disposition, when the light emitting element package is provided in a headlight, a surface light source may be implemented and only some regions in the headlight may be turned on so as to output various signals.

DESCRIPTION OF DRAWINGS

FIG. 1 is a view illustrating an arrangement in a light emitting element package.

FIG. 2 is a view illustrating generation of dark regions in a three-row light emitting element package.

FIG. 3 is a view of a light emitting element in accordance with one embodiment.

FIGS. 4a and 4b are longitudinal-sectional views of light emitting element packages in accordance with embodiments.

FIGS. 5a and 5b are views illustrating dispositions of light emitting elements in the light emitting element package of FIG. 4a.

FIG. 6 is a view illustrating disposition of light emitting elements in the light emitting element package of FIG. 4b.

FIGS. 7a and 7b are longitudinal-sectional views of light emitting elements in accordance with other embodiments.

FIGS. 8a to 8e are views illustrating decrease in dark regions in the light emitting element packages of FIGS. 5a to 7b.

FIGS. 9a to 9c are exploded perspective views illustrating a vehicular lamp unit in accordance with one embodiment.

FIG. 10 is a view illustrating a vehicular backlight including lamp units in accordance with one embodiment.

BEST MODE

Hereinafter, exemplary embodiments to concretely realize the above objects will be described in detail with reference to the accompanying drawings.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" one element may mean an upward direction and a downward direction of the element.

FIG. 3 is a view of a light emitting element in accordance with one embodiment.

A light emitting element 100 in accordance with this embodiment may be applied to all light emitting elements within a light emitting element package below and, in addition to a vertical type light emitting element which is shown, a horizontal type light emitting element may be applied.

A light emitting structure 20 within the light emitting element 100 includes a first conductivity-type semiconductor layer 22, an active layer 24 and a second conductivity-type semiconductor layer 26.

The first conductivity-type semiconductor layer 22 may be formed of a compound semiconductor, i.e., a group III-V or group II-VI compound semiconductor, and be doped with a first conductivity-type dopant. For example, the first conductivity-type semiconductor layer 22 may be formed of a semiconductor material having a composition of $Al_xIn_yGa_{1-x-y}N$ ($0 \leq x \leq 1$, $0 \leq y \leq 1$, $0 \leq x+y \leq 1$), i.e., at least one of AlGaN, GaN, InAlGaN, AlGaAs, GaP, GaAs, GaAsP and AlGaInP.

If the first conductivity-type semiconductor layer 22 is an n-type semiconductor layer, the first conductivity-type dopant may include an n-type dopant, such as Si, Ge, Sn, Se, and Te. The first conductivity-type semiconductor layer 22 may be formed in a single layer or multilayer structure, without being limited thereto.

If the light emitting element 100 is an ultraviolet (UV), deep UV or nonpolar light emitting element, the first conductivity-type semiconductor layer 22 may include at least one of InAlGaN and AlGaN.

The active layer 24 is disposed between the first conductivity-type semiconductor layer 22 and the second conductivity-type semiconductor layer 26 and may include any one of a single-well structure, a multi-well structure, a single-quantum well structure, a multi-quantum well (MQW) structure, a quantum dot structure and a quantum wire structure.

The active layer 24 is formed of a group III-V compound semiconductor material and includes a well layer and a barrier layer having a pair structure of any one or more of AlGaN/AlGaN, InGaN/GaN, InGaN/InGaN, GaN/AlGaN, InAlGaN/GaN, GaAs(InGaAs)/AlGaAs, and GaP(InGaP)/AlGaP, but is not limited thereto. The well layer may be formed of a material having a smaller energy band gap than the energy band gap of the barrier layer.

The second conductivity-type semiconductor layer 26 may be formed of a compound semiconductor. The second conductivity-type semiconductor layer 126 may be formed of a compound semiconductor, such as a group III-V or group II-VI compound semiconductor, and be doped with a second conductivity-type dopant. For example, the second conductivity-type semiconductor layer 26 may be formed of a semiconductor material having a composition of $In_xAl_yGa_{1-x-y}N$ ($0 \leq x \leq 1$, $0 \leq y \leq 1$, $0 \leq x+y \leq 1$), i.e., at least one of AlGaN, GaN, AlInN, AlGaAs, GaP, GaAs, GaAsP and AlGaInP.

If the second conductivity-type semiconductor layer 26 is a p-type semiconductor layer, the second conductivity-type dopant may be a p-type dopant, such as Mg, Zn, Ca, Sr and Ba. The second conductivity-type semiconductor layer 26 may be formed in a single layer or multilayer structure, without being limited thereto. If the light emitting element 100 is an ultraviolet (UV), deep UV or nonpolar light emitting element, the second conductivity-type semiconductor layer 26 may include at least one of InAlGaN and AlGaN.

Prominences and depressions may be formed on the surface of the first conductivity-type semiconductor layer 22 and improve light extraction efficiency, and a first electrode 70 may be disposed on the first conductivity-type semiconductor layer 22. The first electrode 70 may be formed of a conductive material, for example, a metal, more particularly, Ag, Ni, Al, Rh, Pd, Ir, Ru, Mg, Zn, Pt, Au, Hf or a selective combination thereof and formed in a single layer or multilayer structure.

The light emitting structure 20, particularly, the second conductivity-type semiconductor layer 26, may be disposed on an ohmic layer 30, a reflective layer 40, a junction layer 50 and a metal support 60, and the ohmic layer 30, the reflective layer 40, the junction layer 50 and the metal support 60 may serve as a second electrode.

The ohmic layer 30 may have a thickness of about 200 angstroms. The ohmic layer 30 may include at least one of indium tin oxide (ITO), indium zinc oxide (IZO), indium zinc tin oxide (IZTO), indium aluminum zinc oxide (IAZO), Indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/TIO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto.

The reflective layer 40 may be a metal layer including aluminum (Al), silver (Ag), nickel (Ni), platinum (Pt), rhodium (Rh) or an alloy including Al, Ag, Pt or Rh. Aluminum or silver effectively reflects light generated from the active layer 24 and may thus greatly improve light extraction efficiency of the light emitting element.

The metal support 60 may use a metal having excellent electrical conductivity, and use a metal having excellent thermal conductivity because it sufficiently radiates heat generated when the light emitting element is operated.

The metal support 60 may be formed of a metal or a semiconductor material. Further, the metal support 60 may be formed of a material having high electrical conductivity and thermal conductivity. For example, the metal support 60 may be formed of a material selected from the group consisting of molybdenum (Mo), silicon (Si), tungsten (W), copper (Cu) and aluminum (Al) or an alloy thereof, and selectively include gold (Au), a copper (Cu) alloy, nickel (Ni), copper-tungsten (Cu—W), a carrier wafer (for example, GaN, Si, Ge, GaAs, ZnO, SiGe, SiC, SiGe, $Ga_2O_3$, etc.)

The metal support 60 may have a mechanical strength sufficient to prevent warpage of the overall nitride semiconductor and to effectively separate the nitride semiconductor into separate chips through a scribing process and a breaking process.

The junction layer 50 serves to bond the reflective layer 40 and the metal support 60 to each other and may be formed of a material selected from the group consisting of gold (Au), tin (Sn), indium (In), aluminum (Al), silicon (Si), silver (Ag), nickel (Ni) and copper (Cu) or an alloy thereof.

The ohmic layer 30 and the reflective layer 40 may be formed by sputtering or e-beam evaporation, and the metal support 60 may be formed by electrochemical metal deposition or bonding using a eutectic metal and the separate junction layer 50 may be formed thereon.

A passivation layer 80 may be disposed around the light emitting structure 20. The passivation layer 80 may be formed of an insulating material and the insulating material may be a non-conductive oxide or nitride. For example, the passivation layer 80 may be formed of a silicon oxide ($SiO_2$) layer, an oxynitride layer or an aluminum oxide layer.

FIGS. 4a and 4b are longitudinal-sectional views of light emitting element packages in accordance with embodiments.

In a light emitting element package 200a shown in FIG. 4a, circuit boards include a first region a and second regions $b_1$ and $b_2$ having different heights and arrays of light emitting elements 100a and 100b are disposed at different heights on the first region a and the second regions $b_1$ and $b_2$. The first region a may be the surface of a first circuit board 210 and the second regions $b_1$ and $b_2$ may be the surfaces of second circuit boards 215.

The first circuit board 210 may be bonded to the second circuit boards 215 through a bonding layer 212, a part of the first circuit board 210 may form a cavity, and the bottom surface of the cavity may be the first region a.

In the light emitting element package 200a having the illustrated structure, since two arrays of light emitting elements 100a disposed in the first region a and two arrays of light emitting elements 100b disposed in the second regions $b_1$ and $b_2$ are disposed at different heights, spaces for wire-bonding of, particularly, the two arrays of the light emitting elements 100a disposed in the first region a may be secured, a distance between the respective arrays of the light emitting elements 100a and 100b may be reduced, thereby preventing generation of dark regions.

Although this longitudinal-sectional views illustrates four arrays of light emitting elements 100a and 100b, a plurality of light emitting elements may be disposed in other directions (for example, the vertical direction), as shown in FIG. 8a below. Since wire-bonding is performed only in the direction shown in FIG. 4a (for example, the horizontal direction), wire-bonding regions in other directions may not be separately secured.

A light emitting element package 200b shown in FIG. 4b has a similar structure to the structure shown in FIG. 4a but includes only one light emitting element 100a disposed in the first region a. That is, the light emitting element package 200b in accordance with this embodiment differs from the embodiment shown in FIG. 4a in that three arrays of light emitting elements 100a and 100b of the light emitting element package 200b are illustrated in one direction (for example, the horizontal direction).

FIGS. 5a and 5b are views illustrating dispositions of light emitting elements in the light emitting element package of FIG. 4a.

In the light emitting element package 200a in FIG. 5a, the first circuit board 210 and the second circuit boards 215 may be bonded through the bonding layer 212, the first circuit board 210 and the second circuit boards 215 may be printed circuit boards (PCBs), metal PCBs or flexible PCBs, and the bonding layer 212 may be a conductive or non-conductive adhesive.

The cavity is formed on the first circuit board 210, the bottom surface of the cavity forms the first region a, and two arrays of the light emitting elements 100a may be disposed in the first region a. FIG. 5a is a longitudinal-sectional view and, thus, arrays of the light emitting elements 100a may be substantially disposed in two columns and four rows or more, as exemplarily shown in FIG. 8a.

A pair of arrays of the light emitting elements 100a is disposed on the bottom surface of the above-described cavity, i.e., in the first region a and a phosphor layer 150a is disposed on the respective light emitting elements 100a using a conformal coating method. In this embodiment, the light emitting elements 100a are bonded to the circuit board by wires 160a such that $(1-1)^{th}$ bonding pads 190a on the light emitting elements 100a are connected to $(2-1)^{th}$ bonding pads 210a on the circuit board 210 by the wires 160a.

A part of the phosphor layer 150a is opened such that the $(1-1)^{th}$ bonding pad 190a is disposed in the opened part and a space for bonding of the wire 160a is secured, and the phosphor layer 150a may be disposed on the side surface of the light emitting element 100a in addition to the upper surface of the light emitting element 100a.

A pair of the second circuit boards 215 may be disposed opposite each other across the above-cavity. The surfaces of the opposite second circuit boards 215 may be referred to as the second regions and the second regions may include a $(2-1)^{th}$ region $b_1$ and a $(2-2)^{th}$ region $b_2$ opposite each other. The height of the second regions including the $(2-1)^{th}$ region $b_1$ and the $(2-2)^{th}$ region $b_2$ is greater than the height of the first region a.

The structure of the arrays of the light emitting elements 100b disposed in the $(2-1)^{th}$ region $b_1$ and the $(2-2)^{th}$ region $b_2$ is the same as the structure of the arrays of the light emitting elements 100a disposed in the first region a. That is, the arrays of the light emitting elements 100b are disposed on the surfaces of the second circuit boards 215, i.e., on the $(2-1)^{th}$ region $b_1$ and the $(2-2)^{th}$ region $b_2$, and a phosphor layer 150b is disposed on the respective light emitting elements 100b using a conformal coating method. $(1-2)^{th}$ bonding pads 190b on the light emitting elements 100b are connected to $(2-2)^{th}$ bonding pads 215a on the second circuit boards 215 by wires 160b.

A part of the phosphor layer 150b is opened such that the $(1-2)^{th}$ bonding pad 190b is disposed in the opened part and a space for bonding of the wire 160b is secured, and the phosphor layer 150b may be disposed on the side surface of the light emitting element 100b in addition to the upper surface of the light emitting element 100b.

The arrays of the light emitting elements 100b disposed in the $(2-1)^{th}$ region $b_1$ and the $(2-2)^{th}$ region $b_2$ are bonded to the circuit boards through the wires 160b in the opposite direction to the direction of the first region a, i.e., in the outward direction of FIG. 5a, and may thus be disposed adjacent to the arrays of the light emitting elements 100a on the first region a in the horizontal direction.

When the first circuit board 210 and the second circuit boards 215 do not have different heights, the $(2-1)^{th}$ bonding pads 210a, to which the light emitting elements 100a in the first region a are bonded by the wires 160a, are excessively close to the light emitting elements 100b and wire-bonding of a manufacturing process may be difficult. However, in the structure shown in FIG. 5a, the cavity may be formed on the first circuit board 210, the arrays of the light emitting elements 100a may be disposed in the cavity, and the second circuit board 215 may be disposed after the wire-bonding process through the wires 160a.

The height $h_1$ of the light emitting elements 100a and 100b may be 90 μm to 100 μm, the height $h_2$ of the phosphor layer 150a may be 50 μm to 60 μm, and the height $h_3$ of the wires 160a may be about 160 μm and be similar to the height $h_1$ of the light emitting elements 100a and 100b and the height $h_2$ of the phosphor layer 150a. The above-described heights $h_1$, $h_2$ and $h_3$ are heights from the bottom surface of the cavity of the first circuit board 210.

The depth $h_4$ of the cavity may be a difference between the height of the light emitting elements 100a in the first region a and the height of the light emitting elements 100b in the second regions and be 160 μm to 5 mm. When the depth $h_4$ of the cavity is excessively small, the wires 160a may be damaged during formation of the second circuit boards 215 and, when the depth $h_4$ of the cavity is excessively great, a lighting apparatus or a headlight may have non-uniformity in luminance due to luminances or viewing angles of the light emitting elements 100a in the first region a and the light emitting elements 100b in the second regions.

If the respective light emitting elements 100a and 100b are disposed by a distance of within 100 μm in the horizontal direction, generation of dark regions may be prevented. A pair of the light emitting elements 100a disposed in the first region a may be separated from each other by a distance $d_3$ of 50 μm to 100 μm. When the separation distance of the pair of the light emitting elements 100a disposed in the first region a is less than 50 μm, it may be difficult to mount a pair of light emitting elements 100a during the manufacturing process and, when the separation distance of the pair of the light emitting elements 100a disposed in the first region a is greater than 100 mm, a dark region may be generated between a pair of the light emitting elements 100a.

In order to secure the above-described separation distance, wire-bonding of the light emitting elements 100 disposed in the first region a is performed in the outward direction in FIG. 5a. That is, wire-bonding of a pair of the light emitting elements 100a disposed in the first region a is performed in a direction to the light emitting elements 100b disposed in the second regions.

The separation distance $d_4$ between the light emitting elements 100a in the first region a and the light emitting elements 100b in the $(2-1)^{th}$ region $b_1$ or the $(2-2)^{th}$ region $b_2$, which are disposed adjacent to each other, may be 50 μm to 100 μm in the horizontal direction. When the separation distance $d_4$ is less than 50 μm, spaces for wire-bonding may be insufficient and, when the separation distance $d_4$ is greater than 100 μm, a dark region may be generated between a pair of the light emitting elements 100a and 100b. The above-described distances $d_3$ and $d_4$ mean separation distances in the horizontal direction. That is, the distance $d_4$ means a separation distance in the horizontal direction if the light emitting elements 100a and 100b are disposed to be coplanar with each other.

A light emitting element package 200a shown in FIG. 5b is similar to the light emitting element package 200a shown in FIG. 5a but a part of each of arrays of light emitting elements 100b disposed in the second regions, i.e., the $(2-1)^{th}$ region $b_1$ and the $(2-2)^{th}$ region $b_2$, faces the bottom surface of the first region a. That is, since a part of a pair of light emitting elements 100b protrudes to the inside of the cavity on the first circuit board 210, as compared to FIG. 5a, and a part of the second circuit board 215 protrudes to the inside of the cavity on the first circuit board 210, the pair of the light emitting elements 100b may be disposed so as not to be directly opposite the bottom surface of the first region a.

In the light emitting element package 200a having the above structure, the separation distance between the light emitting element 100a in the first region a and the light emitting element 100b in the $(2\text{-}1)^{th}$ region $b_1$ or the $(2\text{-}2)^{th}$ region $b_2$ may be within 100 μm, or be zero, as exemplarily shown in the figure. In FIG. 5b, coincidence of the edges of the light emitting element 100a in the first region a and the light emitting element 100b in the $(2\text{-}1)^{th}$ region $b_1$ or the $(2\text{-}2)^{th}$ region $b_2$ may be coincidence of the edges of active layers thereof.

FIG. 6 is a view illustrating disposition of light emitting elements in the light emitting element package of FIG. 4b.

The light emitting element package 200b in accordance with this embodiment is similar to the embodiment shown in FIG. 5b but differs in that only one light emitting element 100a is disposed in the first region a. Therefore, since a part of a pair of light emitting elements 100b protrudes to the inside of the cavity on the first circuit board 210 and a part of the second circuit board 215 protrudes to the inside of the cavity on the first circuit board 210, the pair of the light emitting elements 100b may be disposed so as not to be directly opposite the bottom surface of the first region a.

In the light emitting element package 200a having this structure, a separation distance between both edges of the light emitting element 100a in the first region a and the light emitting elements 100b in the $(2\text{-}1)^{th}$ region $b^1$ and the $(2\text{-}2)^{th}$ region $b_2$ in the horizontal direction may be zero, as shown in this figure. Further, in the embodiment shown in FIG. 6, if the light emitting elements 100b in the $(2\text{-}1)^{th}$ region $b_1$ or the $(2\text{-}2)^{th}$ region $b_2$ do not protrude to the cavity, the separation distance between both edges of the light emitting element 100a in the first region a and the light emitting elements 100b in the $(2\text{-}1)^{th}$ region $b_1$ and the $(2\text{-}2)^{th}$ region $b_2$ in the horizontal direction may be within 100 μm.

Although not shown, the separation distance between the light emitting element 100a and the $(2\text{-}1)^{th}$ region b1 and $(2\text{-}2)^{th}$ region b2 in the horizontal direction may be equal to the distance d4 shown in FIG. 5a, etc.

In the above-described embodiments and embodiments which will be described later, since light emitting elements are disposed at different heights, output of the light emitting elements disposed in the first region may be greater than output of the light emitting elements disposed in the second regions and, if three or more regions having different heights are provided, output of light emitting elements disposed at a lower region may be higher.

In the above-described embodiments, a pair of second regions, i.e., the $(2\text{-}1)^{th}$ region b1 and the $(2\text{-}2)^{th}$ region b2, are disposed opposite each other across the first region a so as to be symmetrical to each other and the light emitting elements 160b disposed on the $(2\text{-}1)^{th}$ region b1 and the $(2\text{-}2)^{th}$ region b2 are symmetrical to each other with respect to the first region a.

In embodiments, which will be described later, a pair of third regions, i.e., a $(3\text{-}1)^{th}$ region c1 and a $(3\text{-}2)^{th}$ region bc, is disposed opposite each other across the first region a so as to be symmetrical to each other and light emitting elements 160c disposed on the $(3\text{-}1)^{th}$ region c1 and the $(3\text{-}2)^{th}$ region c2 are symmetrical to each other with respect to the first region a.

FIGS. 7a and 7b are longitudinal-sectional views of light emitting elements in accordance with other embodiments, in which circuit boards are disposed in three regions having different heights.

A light emitting element package 200c shown in FIG. 7a includes third circuit boards 225 in addition to a first circuit board 210 and second circuit boards 215, the first circuit board 210 and the second circuit boards 215 may be bonded by a bonding layer 212, and the second circuit boards 215 and the third circuit boards 225 may be bonded by a bonding layer 222.

A cavity is formed within the first circuit board 210, the bottom surface of the cavity forms a first region a, and a pair of light emitting elements 100a is disposed on the first region a. The configuration and disposition of the light emitting elements 100a are the same as those of the embodiment shown in FIG. 5a.

A pair of the second circuit boards 215 is disposed across the cavity in the first circuit board 210, and the respective second circuit boards 215 have a staircase structure. Such a staircase structure of the second circuit board 215 is configured that the height of a region of the second circuit board 215 in the direction of the first region a is lower than the edge region and an array of light emitting elements 100b is disposed in the region having a low height. Regions on the second circuit boards 215 on which arrays of the light emitting elements 100b are disposed may be referred to as a $(2\text{-}1)^{th}$ region $b_1$ and a $(2\text{-}2)^{th}$ region $b_2$. The configuration and disposition of the pair of light emitting elements 100b disposed on the $(2\text{-}1)^{th}$ region $b_1$ and the $(2\text{-}2)^{th}$ region $b_2$ are the same as those of the embodiment shown in FIG. 5a.

A difference h4 of heights between a $(3\text{-}1)^{th}$ region C1 and the $(2\text{-}1)^{th}$ region B1 may be 160 μm to 5 mm which is equal to the difference h4 of heights between the light emitting elements 100a on the first region a and the light emitting elements 100b on the second regions of FIG. 5a. When the height $h_4$ of the second circuit boards is excessively small, wires 160b may be damaged during formation of the third circuit boards 225 and, when the height $h_4$ of the second circuit boards is excessively great, a lighting apparatus or a headlight may have non-uniformity in luminance due to luminances or viewing angles of the light emitting elements 100b on the $(2\text{-}1)^{th}$ region $b_1$ and the $(2\text{-}2)^{th}$ region $b_2$ and light emitting elements 100c on the third regions.

A pair of the third circuit boards 225 may be disposed opposite each other across the $(2\text{-}1)^{th}$ region $b_1$ and the $(2\text{-}2)^{th}$ region $b_2$. The pair of the opposite third circuit boards 225 may be referred to as the third regions, and a $(3\text{-}1)^{th}$ region $c_1$ and a $(3\text{-}2)^{th}$ region $c_2$ are disposed opposite each other. The height of the third regions including the $(3\text{-}1)^{th}$ region $c_1$ and the $(3\text{-}2)^{th}$ region $c_2$ is higher than the height of the first region a and the height of the $(2\text{-}1)^{th}$ region $b_1$ and the $(2\text{-}2)^{th}$ region $b_2$.

The structure of arrays of light emitting elements 100c disposed on the $(3\text{-}1)^{th}$ region $c_1$ and the $(3\text{-}2)^{th}$ region $c_2$ is the same as the structure of the arrays of the light emitting elements 100a disposed in the first region a. That is, the arrays of the light emitting elements 100c are disposed on the surfaces of the third circuit boards 225, i.e., on the $(3\text{-}1)^{th}$ region $c_1$ and the $(3\text{-}2)^{th}$ region $c_2$, and a phosphor layer 150c is disposed on the respective light emitting elements 100c using a conformal coating method. $(1\text{-}3)^{th}$ bonding pads 190c on the light emitting elements 100c are connected to $(2\text{-}3)^{th}$ bonding pads 225a on the third circuit boards 225 by wires 160c.

A part of the phosphor layer 150c is opened such that the $(1\text{-}3)^{th}$ bonding pad 190c is disposed in the opened part and a space for bonding of the wire 160c is secured, and the phosphor layer 150c may be disposed on the side surface of the light emitting element 100c in addition to the upper surface of the light emitting element 100c.

The arrays of the light emitting elements 100c disposed in the $(3\text{-}1)^{th}$ region $c_1$ and the $(3\text{-}2)^{th}$ region $c_2$ are bonded to the circuit boards through the wires 160c in the opposite direction to the direction of the $(2\text{-}1)^{th}$ region $b_1$ and the $(2\text{-}2)^{th}$ region $b_2$, i.e., in the outward direction of FIG. 7a, and may thus be disposed adjacent to the arrays of the light emitting elements 100b on the $(2\text{-}1)^{th}$ region $b_1$ and the $(2\text{-}2)^{th}$ region $b_2$ in the horizontal direction.

A separation distance $d_5$ between the light emitting elements 100b in the $(2\text{-}1)^{th}$ region $b_1$ or the $(2\text{-}2)^{th}$ region $b_2$ and the light emitting elements 100c in the $(3\text{-}1)^{th}$ region $c_1$ or the $(3\text{-}2)^{th}$ region $c_2$, which are disposed adjacent to each other, may be 50 µm to 100 µm in the horizontal direction. When the separation distance $d_5$ is less than 50 µm, spaces for bonding of the wires 160b may be insufficient and, when the separation distance $d_5$ is greater than 100 µm, a dark region may be generated between a pair of the light emitting elements 100b and 100b.

The light emitting elements 100b are wire-bonded to the $(2\text{-}1)^{th}$ region $b_1$ or the $(2\text{-}2)^{th}$ region $b_2$ having the above-described separation distance $d_5$ of 50 µm to 100 µm in the horizontal direction.

The arrays of the light emitting elements 100c disposed in the $(3\text{-}1)^{th}$ region $c_1$ and the $(3\text{-}2)^{th}$ region $c_2$ are bonded to the circuit boards through the wires 160c in the opposite direction to the direction of the $(2\text{-}1)^{th}$ region $b_1$ or the $(2\text{-}2)^{th}$ region $b_2$, i.e., in the outward direction of FIG. 7a, and may thus be disposed adjacent to the arrays of the light emitting elements 100b on the $(2\text{-}1)^{th}$ region $b_1$ and the $(2\text{-}2)^{th}$ region $b_2$ in the horizontal direction.

A light emitting element package 200b shown in FIG. 7b is similar to the light emitting element package 200a shown in FIG. 7a, but one light emitting element 100a is disposed on the first region a, a part of each of arrays of light emitting elements 100b disposed on the second regions, i.e., the $(2\text{-}1)^{th}$ region $b_1$ and the $(2\text{-}2)^{th}$ region $b_2$, are disposed so as to be opposite the bottom surface of the first region a, and a part of each of arrays of light emitting elements 100c disposed on the third regions, i.e., the $(3\text{-}1)^{th}$ region $b_1$ and the $(3\text{-}2)^{th}$ region $b_2$, are disposed so as to be opposite the bottom surfaces of the $(2\text{-}1)^{th}$ region $b_1$ and the $(2\text{-}2)^{th}$ region $b_2$.

That is, since a part of a pair of light emitting elements 100b protrudes to the inside of the cavity on the first circuit board 210, as compared to FIG. 7a, and a part of each of the second circuit boards 215 protrudes to the inside of the cavity on the first circuit board 210, the pair of the light emitting elements 100b may be disposed so as not to be directly opposite the bottom surface of the first region a. Further, since a part of a pair of light emitting elements 100c protrudes to the insides of cavities on the second circuit boards 215, as compared to FIG. 7a, and a part of each of the third circuit boards 225 protrudes to the inside of the cavities on the second circuit boards 215, the pair of the light emitting elements 100c may be disposed so as not to be directly opposite the bottom surfaces of the $(2\text{-}1)^{th}$ region $b_1$ and the $(2\text{-}2)^{th}$ region $b_2$.

In the light emitting element package 200d having this structure, a separation distance between the light emitting element 100a in the first region a and the light emitting element 100b in the $(2\text{-}1)^{th}$ region $b_1$ or the $(2\text{-}2)^{th}$ region $b_2$ in the horizontal direction may be within 100 µm, or be zero, as exemplarily shown in the figure. Further, a separation distance between the light emitting element 100b in the $(2\text{-}1)^{th}$ region $b_1$ or the $(2\text{-}2)^{th}$ region $b_2$ and the light emitting element 100c in the $(3\text{-}1)^{th}$ region $b_1$ or the $(3\text{-}2)^{th}$ region $b_2$ in the horizontal direction may be within 100 µm, or be zero, as exemplarily shown in the figure.

Further, in this embodiment, only one light emitting element 100a may be disposed on the first region a and a separation distance between both edges of the light emitting element 100a in the first region a and the light emitting elements 100b in the $(2\text{-}1)^{th}$ region $b_1$ or the $(2\text{-}2)^{th}$ region $b_2$ in the horizontal direction may be zero, as exemplarily shown in the figure.

FIGS. 7a and 7b illustrate the light emitting elements as being disposed in regions having different heights and, by adding the structure of the three circuit boards and the light emitting elements 100c, a light emitting element package having light emitting elements disposed at four or more different heights may be implemented.

FIGS. 8a to 8e are views illustrating decrease in dark regions in the light emitting element packages of FIGS. 5a to 7b.

FIG. 8a is a plan view of the light emitting element package shown in FIG. 5a and schematically illustrates only the light emitting elements and intervals therebetween. The distance between the light emitting elements 100a on the first region in the horizontal direction is 50 µm to 100 µm and the distance between the light emitting element 100a on the first region and the light emitting element 100b on the second region, which are disposed adjacent to each other, in the horizontal direction is 50 µm to 100 µm. Distances between the respective light emitting elements 100a and 100b in other directions, i.e., in the vertical direction of FIG. 8a, are not specifically limited because wire-bonding is performed only in the above-described horizontal direction.

FIG. 8b is a plan view of the light emitting element package shown in FIG. 5b and schematically illustrates only the light emitting elements and intervals therebetween. The distance between the light emitting elements 100a on the first region in the horizontal direction is 50 µm to 100 µm and the distance between the light emitting element 100a on the first region and the light emitting element 100b on the second region, which are disposed adjacent to each other, in the horizontal direction is zero. Distances between the respective light emitting elements 100a and 100b in other directions, i.e., in the vertical direction of FIG. 8b, are not specifically limited because wire-bonding is performed only in the above-described horizontal direction.

FIG. 8c is a plan view of the light emitting element package shown in FIG. 6 and schematically illustrates only the light emitting elements and intervals therebetween. One light emitting element 100a is disposed on the first region and the distance between the light emitting element 100a on the first region and the light emitting element 100b on the second region, which are disposed adjacent to each other, in the horizontal direction is zero. Distances between the respective light emitting elements 100a and 100b in other directions, i.e., in the vertical direction of FIG. 8c, are not specifically limited because wire-bonding is performed only in the above-described horizontal direction.

FIG. 8d is a plan view of the light emitting element package shown in FIG. 7a and schematically illustrates only the light emitting elements and intervals therebetween. The distance between the light emitting elements 100a on the first region in the horizontal direction is 50 µm to 100 µm, the distance between the light emitting element 100a on the first region and the light emitting element 100b on the second region, which are disposed adjacent to each other, in the horizontal direction is 50 µm to 100 µm, and the distance between the light emitting element 100b on the second region and the light emitting element 100c on the third region, which are disposed adjacent to each other, in the horizontal direction is 50 µm to 100 µm. Distances between the respective light emitting elements 100a, 100b and 100c in other directions, i.e., in the vertical direction of FIG. 8a, are not specifically limited because wire-bonding is performed only in the above-described horizontal direction.

FIG. 8e is a plan view of the light emitting element package shown in FIG. 7b and schematically illustrates only the light emitting elements and intervals therebetween. One light emitting element 100a is disposed on the first region, the distance between the light emitting element 100a on the first region and the light emitting element 100b on the second region, adjacent to the light emitting element 100a on the first region, in the horizontal direction is zero, and the distance between the light emitting element 100b on the second region and the light emitting element 100c on the third region, adjacent to the light emitting element 100b on the second region, in the horizontal direction is zero.

In FIGS. 8b, 8c and 8e, two light emitting elements, three light emitting elements, and fifth light emitting elements are disposed adjacent to each other in the horizontal direction and may implement the same effects as disposition of a surface light source.

In the above-described light emitting element packages, light emitting element arrays may be disposed adjacent to each other and implement a surface light source and, when the respective light emitting elements are connected in parallel, local dimming in which current is supplied to some light emitting elements in one light emitting element package may be implemented. Through such disposition, when the light emitting element package is provided in a headlight, a surface light source may be implemented and only some regions in the headlight may be turned on so as to output various signals.

FIGS. 9a to 9c are exploded perspective views illustrating a vehicular lamp unit in accordance with one embodiment.

As exemplarily shown in FIGS. 9a to 9c, the lamp unit may include a base plate 400 on which a plurality of light emitting elements 100 are disposed, a spacer 700, and an optical member 600.

Here, the light emitting elements 100 may be disposed on the base plate 400 and the base plate 400 may include an electrode pattern to conductibly connect the light emitting elements 100. The light emitting elements 100 may be the light emitting elements disposed in the above-described light emitting element packages and a plurality of light emitting elements may be disposed adjacent to each other in some regions.

Further, the base plate 400 may be manufactured so as to have flexibility, be a printed circuit board (PCB) formed of one selected from the group consisting of polyethylene terephthalate (PET), glass, polycarbonate (PC), silicon (Si), polyimide and epoxy, and be formed in a film type.

Further, the base plate 400 may selectively use a single layer PCB, a multilayer PCB, a ceramic substrate, a metal core and a PCB.

The base plate 400 may be warped using a soft material in such a manner or be warped by structural deformation.

Therefore, the base plate 400 may include one or more curved surfaces having curvature.

The base plate 400 may include a hole in a region corresponding to a connection projection of a lens 200.

Here, the lens 200 may be coupled with the base plate 400 through the hole of the base plate 400.

Further, the base plate 400 may include fixing projections 420 protruding in the downward direction opposite to the upper surface of the base plate 400 facing the light emitting elements 100.

Here, the base plate 400 may be fixed to an object having curvature to be mounted on the base plate 400 through the fixing projections 420.

Further, any one of a reflective coating film or a reflective coating material layer may be formed on the base plate 400 and the base plate 400 may reflect light generated by light sources towards the optical member 600.

Here, the reflective coating film or the reflective coating material layer may include a metal or a metal oxide having high reflectivity, such as aluminum (Al), silver (Ag), gold (Au), and titanium dioxide ($TiO_2$).

According to circumstances, a plurality of radiation pins to radiate heat generated from the light sources.

The light emitting elements 100 may be LED chips and include red LED chips, blue LED chips or UV LED chips or be provided in a package type including at least one of a red LED chip, a green LED chip, a blue LED chip, a yellow green LED chip and a white LED chip.

If the lamp unit is applied to a vehicular backlight, the light emitting elements 100 may be vertical type light emitting chips, for example, red light emitting chips, but are limited thereto.

The spacer 700 may be disposed between the base plate 400 and the optical member 600 and support the edge of the optical member 600.

Here, the spacer 700 may include a bottom surface facing the base plate 400 and a side surface extending from the edge of the bottom surface in a direction to the optical member 600.

Further, the bottom surface of the spacer 700 may be spaced from the base plate 400 by a designated interval.

However, according to circumstances, the bottom surface of the spacer 700 may contact the base plate 400.

Further, the bottom surface of the spacer 700 may include one or more curved surfaces having curvature.

Further, the side surface of the spacer 700 may be inclined from the bottom surface of the spacer 700.

Any one of a reflective coating film or a reflective coating material layer may be formed on the spacer 700 and the spacer 700 may reflect light generated by the light sources 100 towards the optical member 600.

Here, the reflective coating film or the reflective coating material layer may include a metal or a metal oxide having high reflectivity, such as aluminum (Al), silver (Ag), gold (Au), and titanium dioxide ($TiO_2$).

Next, the optical member 600 may be disposed with a space of a designated interval from the base plate 400 and a light mixing area may be formed in the space between the base plate 400 and the optical member 600.

Here, the optical member 600 may be spaced from the base plate 400 by the designated interval and such an interval may be about 10 mm or more.

If the distance between the optical member 600 and the base plate 400 is less than about 10 mm, the lamp unit does not exhibit uniform luminance, a hot spot having high luminance may be generated in the regions in which the light sources 100 are located, and a dark spot having relatively low luminance may be generated.

Further, the optical member 600 may include at least one sheet, for example, selectively include a diffusion sheet, a prism sheet and a brightness enhancement sheet.

Here, the diffusion sheet diffuses light emitted from the light emitting elements 100, the prism sheet guides the diffused light to a light emission area, and the brightness enhancement sheet enhances brightness.

For example, the diffusion sheet may be generally formed of an acrylic resin, without being limited thereto, or may be formed of a material executing a light diffusion function, i.e., highly permeable plastic, such as polystyrene (PS), polymethyl methacrylate (PMMA), a cycloolefin copolymer (COC), polyethylene terephthalate (PET), resin, etc.

Further, the optical member 600 may include one or more curved surfaces having curvature.

Here, the optical member 600 may have at least one a concave surface, a convex surface and a flat surface according to the external appearance of a cover member or a target object to be mounted thereon.

As described above, the embodiment forms the light mixing area in a vacant space between the lens 200 to cover the light sources, the base plate 400 and the optical member 600 and may thus implement a surface light source with a small number of light sources.

Here, the surface light source means a light source having a surface-shaped light emitting part to diffuse light and the embodiment may provide a lamp unit which may implement a surface light surface with a small number of light sources disposed adjacent to each other. Further, the light emitting elements are connected in parallel and only some light emitting elements may be turned on in the lamp unit and thus implement various signals in one lamp unit.

FIG. 10 is a view illustrating a vehicular backlight including lamp units in accordance with one embodiment.

As exemplarily shown in this figure, a vehicular backlight 800 includes a first lamp unit 812, a second lamp unit 814, a third lamp unit 816 and a housing 810.

Here, the first lamp unit 812 may be a light source serving as a turn signal lamp, the second lamp unit 814 may be a light source serving as a side lamp, and the third lamp unit 816 may be a light source serving as a stop lamp, without being limited thereto, or the functions thereof are interchangeable.

Further, the housing 810 may receive the first to third lamp units 812, 814 and 816 and be formed of a light-transmitting material.

Here, the housing 810 may be bent according to the design of a vehicle body, and the first to third lamp units 812, 814 and 816 may implement a surface light source which may be warped according to the shape of the housing 810.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A light emitting element package in accordance with one embodiment may implement a surface light source in a vehicular lamp unit, etc.

The invention claimed is:
1. A light emitting element package comprising:
a circuit board unit including a first region and second regions and third regions, a height of the second regions being different from that of the first region, the second regions including a $(2-1)^{th}$ region and a $(2-2)^{th}$ region being opposite each other across the first region, the third regions being disposed at a greater height than that of the second regions, and the third regions including a $(3-1)^{th}$ region and a $(3-2)^{th}$ region being opposite each other across the second regions; and
one or more light emitting elements disposed in each of the first region and the second regions and the third regions,
wherein output of each of the one or more light emitting elements disposed in the first region is greater than output of each of the light emitting elements disposed in the second regions,
wherein a height difference between bottom surfaces of the second regions and bottom surfaces of the third regions is 160 µm to 5 mm,
wherein the circuit board unit comprises a cavity exposing an upper surface of the first region and the one or more light emitting elements disposed in the first region,
wherein a part of each of the second regions protrudes to an inside of the cavity of the first region, and bottom surfaces of the parts of the second regions face the upper surface of the first region,
wherein one of the one or more light emitting elements disposed in the first region has side surfaces, and
wherein an inner side surface of each of the second regions is on a same vertical line as one of the side surfaces of the light emitting element on the first region.

2. The light emitting element package according to claim 1, wherein, in the circuit board unit, a first circuit board of the first region and second circuit boards of the second regions contact each other, and the second circuit boards of the second regions and third circuit boards of the third regions contact each other.

3. The light emitting element package according to claim 1, wherein the height of the second regions is greater than the height of the first region.

4. The light emitting element package according to claim 1, wherein one light emitting element is disposed in the first region and one row of light emitting elements is disposed in each of the $(2-1)^{th}$ region and the $(2-2)^{th}$ region.

5. The light emitting element package according to claim 1, further comprising a phosphor layer disposed on the respective light emitting elements, wherein the height of the respective light emitting elements is 90 µm to 100 µm and the height of the phosphor layer is 50 µm to 60 µm.

6. The light emitting element package according to claim 1, wherein output of the light emitting elements disposed in the second regions is greater than output of the light emitting elements disposed in the third regions.

7. The light emitting element package according to claim 1, wherein a height difference between the upper surface of the first region and the bottom surfaces of the second regions is 160 µm to 5 mm.

8. The light emitting element package according to claim 1, wherein a part of each of the third regions protrudes toward the cavity, and bottom surfaces of the parts of the third regions face an upper surface of one of the second regions.

9. The light emitting element package according to claim 8, wherein outer side surfaces of the light emitting elements disposed in the second regions and inner side surfaces of the light emitting elements on the third regions are respectively on another same vertical line.

10. A light emitting element package comprising:
a circuit board unit including a first region, second regions, and third regions, the second regions being disposed at a greater height than a height of the first region, and the third regions being disposed at a greater height than a height of the second regions; and
at least one light emitting element disposed in each of the first region, the second regions and the third regions,
wherein output of the at least one light emitting element disposed in the first region is greater than output of each of the light emitting elements disposed in the second regions, and the output of each of the light emitting elements disposed in the second regions is greater than output of each of the light emitting elements disposed in the third regions,
wherein one of the at least one light emitting element disposed in the first region has side surfaces,
wherein an inner side surface of each of the second regions is on a same vertical line as one of the side surfaces of the light emitting element in the first region, and
wherein the circuit board unit comprises a cavity exposing an upper surface of the first region and the one or more light emitting elements disposed in the first region.

11. The light emitting element package according to claim 10, wherein a part of each of the second regions protrudes to an inside of the cavity of the first region, and bottom surfaces of the parts of the second regions face the upper surface of the first region.

12. The light emitting element package according to claim 10, wherein a part of each of the third regions protrudes toward the cavity, and bottom surfaces of the parts of the third regions face an upper surface of one of the second regions.

13. The light emitting element package according to claim 12, wherein outer side surfaces of the light emitting elements disposed in the second regions and inner side surfaces of the light emitting elements on the third regions are respectively on another same vertical line.

* * * * *